US011247411B2

(12) United States Patent
Park

(10) Patent No.: US 11,247,411 B2
(45) Date of Patent: Feb. 15, 2022

(54) EMBLEM FOR AUTOMOBILE AND METHOD OF MANUFACTURING THE SAME

(71) Applicant: DLP CO., LTD., Dangjin-si (KR)

(72) Inventor: Jae Young Park, Busan (KR)

(73) Assignee: DLP CO., LTD., Dangjin-si (KR)

( * ) Notice: Subject to any disclaimer, the term of this patent is extended or adjusted under 35 U.S.C. 154(b) by 337 days.

(21) Appl. No.: 16/371,623

(22) Filed: Apr. 1, 2019

(65) Prior Publication Data
US 2019/0299541 A1 Oct. 3, 2019

(30) Foreign Application Priority Data

Apr. 3, 2018 (KR) ........................ 10-2018-0038754

(51) Int. Cl.
*B29C 69/00* (2006.01)
*B29C 45/14* (2006.01)
*B29C 71/02* (2006.01)
*B23K 26/362* (2014.01)
*C23C 14/34* (2006.01)
*B60R 13/00* (2006.01)
*C23C 14/00* (2006.01)
(Continued)

(52) U.S. Cl.
CPC ............ *B29C 69/00* (2013.01); *B23K 26/362* (2013.01); *B29C 45/14* (2013.01); *B29C 71/02* (2013.01); *B60R 13/005* (2013.01); *C23C 14/0015* (2013.01); *B29C 2071/022* (2013.01); *B29K 2027/00* (2013.01); *B29K 2067/00* (2013.01); *B29L 2031/3005* (2013.01); *C23C 14/34* (2013.01)

(58) Field of Classification Search
CPC .................................................. B60R 13/005
See application file for complete search history.

(56) References Cited

U.S. PATENT DOCUMENTS 9,114,760 B2 * 8/2015 Mayer Pujadas .... H01Q 1/3283
2003/0113476 A1 * 6/2003 Fredericksen ........... B05D 7/02
427/475
(Continued)

FOREIGN PATENT DOCUMENTS

JP 2002-135030 A 5/2002
KR 200432005 Y1 * 11/2006 ........... B60R 13/005
(Continued)

OTHER PUBLICATIONS

KR-101586369-B1 (Kim) Jan. 2016 (online machine translation), [Retrieved on Jun. 13, 2021], Retrieved from: Espacenet (Year: 2016).*
"Material Melt and Mould Temperature Chart." PlastikCity, Jun. 6, 2013, www.plastikcity.co.uk/useful-stuff/material-melt-mould-temperatures. (Year: 2013).*
"#006 Basic Knowledge on the Mold Clamping Force: Technical Tutorial." Misumi, Aug. 7, 2009, www.misumi-techcentral.com/tt/en/mold/2009/08/006-basic-knowledge-on-the-mold-clamping-force.html. (Year: 2009).*
(Continued)

*Primary Examiner* — Alison L Hindenlang
*Assistant Examiner* — Andrés E. Behrens, Jr.
(74) *Attorney, Agent, or Firm* — United One Law Group LLC; Kongsik Kim; Jhongwoo Peck

(57) ABSTRACT

A method of manufacturing an automobile emblem is disclosed, which is for manufacturing an emblem that is to be disposed on a front surface of an automobile and represents a particular shape. A method of manufacturing an automobile emblem according to an embodiment of the invention can provide an automobile emblem that has a metallic texture and a silver luster without hindering the reception of waves for an automobile front radar.

20 Claims, 25 Drawing Sheets

(51) Int. Cl.
  *B29K 27/06* (2006.01)
  *B29K 27/00* (2006.01)
  *B29K 67/00* (2006.01)
  *B29L 31/30* (2006.01)

(56) References Cited

U.S. PATENT DOCUMENTS

| | | | | |
|---|---|---|---|---|
| 2005/0223537 | A1* | 10/2005 | Hamilton | B44C 3/082 29/527.4 |
| 2006/0237995 | A1* | 10/2006 | Huttenlocher | B60R 13/005 296/193.1 |
| 2007/0228604 | A1* | 10/2007 | Lee | B29C 59/00 264/271.1 |
| 2008/0277825 | A1* | 11/2008 | Venrooij | B29C 45/02 264/279.1 |
| 2009/0226676 | A1* | 9/2009 | Smith | B60R 13/02 428/195.1 |
| 2011/0253412 | A1* | 10/2011 | Shin | B44F 1/045 174/50 |
| 2013/0177729 | A1* | 7/2013 | Ostrander | B60R 13/005 428/68 |
| 2017/0106810 | A1* | 4/2017 | Hattori | G09F 21/049 |
| 2019/0111599 | A1* | 4/2019 | Matsuo | B29C 45/1643 |
| 2019/0337469 | A1* | 11/2019 | Preisler | B60R 13/005 |
| 2020/0339053 | A1* | 10/2020 | Bicego | B60R 13/005 |
| 2020/0361399 | A1* | 11/2020 | Kim | H01Q 1/3233 |

FOREIGN PATENT DOCUMENTS

| | | |
|---|---|---|
| KR | 10-1586369 B1 | 1/2016 |
| KR | 101586369 B1 * | 1/2016 |
| KR | 10-1662320 B1 | 9/2016 |

OTHER PUBLICATIONS

"Drying." Wikipedia, Wikimedia Foundation, Jul. 17, 2017, en.wikipedia.org/wiki/Drying. (Year: 2017).*
Pye, Andy. "Injection Moulding: the Role of Backpressure: Prospector." Prospector Knowledge Center, Mar. 2, 2018, knowledge.ulprospector.com/7804/pe-injection-moulding-backpressure/#:~:text=Injection%20pressure&text=However%2C%20high%20pressure%20will%20increase,be%20to%20fill%20the%20mould. (Year: 2018).*
KR200432005Y1 (Jang) Jun. 2009 (online machine translation), [Retrieved on Jun. 14, 2021], Retrieved from: Espacenet (Year: 2009).*
Tony, et al. "How To Set Your Spray Gun Air Pressure." How To Paint Your Car—Do-It-Yourself Auto Body and Paint Training Site, Mar. 29, 2014, www.learnautobodyandpaint.com/spray-gun-air-pressure-settings/. (Year: 2014).*
"UV Curable—Illumabond." Epoxies Innovative Bonding Solutions ETC., Apr. 17, 2016, www.epoxies.com/products/uv-curable-illumabond/. (Year: 2016).*
"Sputtering." Wikipedia, Wikimedia Foundation, Jul. 24, 2017, web.archive.org/web/20170724175036/en.wikipedia.org/wiki/Sputtering. (Year: 2017).*
Khojier, Kaykhosrow, et al. "Influence of Argon Gas Flow on Mechanical and Electrical Properties of Sputtered Titanium Nitride Thin Films." Journal of Theoretical and Applied Physics, vol. 7, No. 1, 2013, p. 37., doi:10.1186/2251-7235-7-37. (Year: 2013).*
Hopkinson, David, et al. "How Long Would It Take to Produce 100-200 Um Thick Amorphous Films by Sputtering?" Research Gate, Dec. 2012, researchgate.net/post/How_long_would_it_take_to_produce_100-200_um_thick_amorphous_films_by_sputtering. (Year: 2012).*
Corp., GSL. Overmold Design Guide. Https://Www.avient.com/, 2004, www.polyone.com/sites/default/files/resources/Overmold_Design_Guide.pdf. (Year: 2004).*

* cited by examiner

EMBLEM FOR AUTOMOBILE AND METHOD OF MANUFACTURING THE SAME

CROSS-REFERENCE TO RELATED APPLICATIONS

This application claims the benefit of Korean Patent Application No. 10-2018-0038754, filed on Apr. 3, 2018, the disclosure of which is incorporated herein by reference in its entirety.

BACKGROUND

1. Technical Field

The present invention relates to an emblem for an automobile and a method of manufacturing the same, more particularly to an automobile emblem that may be disposed on the front of an automobile to represent a particular shape and a method of manufacturing such automobile emblem.

2. Description of the Related Art

Vehicle radars mounted on automobiles can be divided into front radars and rear and side radars, where front radars are used as sensors for driving assistance, while rear and side radars are used as sensors for ensuring the safety of the driver.

Devices that use vehicle radars to ensure the safety of the driver include the SCC (smart cruise control) system, the ACC (adaptive cruise control) device, the AEB (autonomous emergency braking) system, and others.

The SCC system is a system that uses a radar mounted on the front of the vehicle to sense the movement of the vehicle in front and maintains a distance from the vehicle front by controlling the engine and brakes accordingly. The SCC radar, which serves as a key component of the smart cruise control, may be advantageously installed at the center on the front of the vehicle to provide the best performance.

On the front of such a vehicle, however, there is usually a radiator grill, an emblem of the automobile manufacturer, or an ornament, etc., positioned at the center.

Typically, a radiator grill is manufactured from metal and plated with chromium to prevent corrosion. However, metal has low wave permeability, and this may have an adverse effect on the transmission and reception of waves by the SCC radar. As such, a method was proposed of providing wave permeability by replacing a partial area of the radiator grill with a separate radar cover that allows adequate transmission and reception of electromagnetic waves.

However, a radar cover is manufactured without metal so as to ensure wave permeability, and as a result, the design continuity with the radiator grill, which is made of metal, may be lost.

To resolve this problem, a technique has been developed of providing portions of the conventional radar cover with a metallic texture by applying indium or tin, which exhibit good wave permeability properties.

The ACC (adaptive cruise control) device is a device capable of quickly measuring and analyzing circumstances in the forward direction, even when there is a lack of visibility, by transmitting electronic waves of a 1-10 millimeter frequency band in a desired direction and computing distances from the received reflection waves reflected off objects in front of the radar.

As for the ACC device, the technology related to precisely transmitting and receiving radar waves and precisely computing the distance to the vehicle in front is of great importance as regards the reliability of the device. Thus, in the related art, technological developments focus on improving the shapes and materials of various structures that are liable to disrupt the transmission and reception of electronic waves.

Prior art related to the ACC device includes Japanese Patent Publication No. 2004-312696. This technology addresses the problem occurring for 1-10 millimeter radar waves, where the transmitted waves are transmitted towards and reflected off objects around the sides of the vehicle, and the reflected waves are received again to cause the detection of unnecessary noise. This related art teaches disposing the radar wave transceiver antenna to face the front of the vehicle and providing the side surfaces of the radar cover with a higher dielectric constant by either embedding layers that have a higher dielectric loss or a higher magnetic loss in the side surfaces or forming the side surfaces with a material having a higher dielectric constant. This related art makes it possible to provide 1-10 millimeter radar waves of superb detection performance with a lightweight, durable, and inexpensive structure that minimizes unnecessary noise by minimizing transmission and reception to and from the sideward directions and minimizing unnecessary reflections.

With the radar wave sensor according to Japanese Patent Publication No. 2004-312696 above, however, even though the waves generated at the transceiver antenna are partially blocked by the side surfaces of the cover, the waves still cannot maintain straightness and are still diffused as they progress forward, whereby unnecessary noise is still incurred as the diffused radar waves are reflected and received.

Moreover, the antenna cover based on such related art is made of a simple plastic material, which, when mounted on the front of a vehicle, may spoil the outward appearance of the vehicle.

Thus, in the relevant field of art, there is an urgent need for a device that can minimize noise by preventing the diffusion of waves transmitted by and received at the radar wave sensor, precisely compute the distance from a forward object, and at the same time keep the outward appearance of the vehicle beautiful.

The AEB (autonomous emergency braking) system is an automatic braking system capable of detecting danger. When the preceding vehicle slows down or stops altogether, or when an obstacle such as a pedestrian, etc., suddenly appears, even if there is no active direction by the driver, the system can sense the situation and determine the danger level to alert the driver or automatically decelerate, and furthermore can autonomously operate the brakes to prevent a collision or minimize the damage.

To prevent a collision between the vehicle and a pedestrian, the AEB system must precisely detect the pedestrian, accurately predict the direction and speed in which the pedestrian is moving, accurately determine, based on the predicted information, whether or not a collision will occur and the predicted time of the collision, and if a collision is predicted, output a danger alert directing the driver to avoid the pedestrian or automatically activate the brakes before the collision.

While the AEB system uses various types of sensors for precisely detecting pedestrians and detecting distances, the performance of each type of sensor has a limitation. In particular, in environments involving nighttime driving, foul weather, and various natural and man-made obstacles that hinder the detection of pedestrians, the performance of the AEB system cannot be guaranteed due to technical limitations of the sensor.

The recently published AEBS requirements of the Euro NCAP stipulate that a vehicle driving at 20-60 km/h must be capable of detecting risks of collision with pedestrians walking at 3-8 km/h. However, there are technological limitations for a vehicle driving at 20 km/h or faster to detect the sudden appearance of a pedestrian, determine the risk of a collision, decide that a collision is possible, and decelerate or halt the vehicle in such a short duration of time. This is especially true if the pedestrian is hidden from view by a parked vehicle, so that the detection of the pedestrian is more difficult. Thus, it is very difficult to satisfy the requirements of the Euro NCAP.

Also, the CP2 scenario (Running Child from Nearside from Obstruction) in the requirements of the Euro NCAP relates to responding to a collision risk by detecting a child pedestrian who is completely obstructed from view by a stationary vehicle. Under the unforgiving conditions of a child pedestrian, who has an irregular behavioral pattern not to mention a smaller size compared to a typical adult, suddenly running to the front or side of the vehicle from a place hidden from view by another vehicle, implementing the AEB system to predict and prevent a collision entails numerous technical limitations.

Registered U.S. Pat. No. 6,862,537 relates to a 'Sensor fusion system architecture' and discloses a technology in which various sensors having different characteristics are disposed at various locations of a vehicle as a sensor system for identifying the surroundings of the vehicle, and the various sensor information obtained through the sensor system is collected and merged to enable a more accurate understanding of the surroundings of the vehicle.

However, even with the above prior art, there are still difficulties in detecting a child pedestrian who is completely hidden from view by a stationary vehicle and quickly determining and responding to a risk of collision.

Devices that use vehicle radars to ensure the safety of the driver include the SCC (smart cruise control) system, the ACC (adaptive cruise control) device, the AEB (autonomous emergency braking) system, and others.

In the devices described above that use a vehicle radar to ensure the safety of the driver, a radar that is disposed on the front of the vehicle should collect information by measuring the distances to other automobiles that are in front either in the same lane or in a neighboring lane, so that the vehicle may assist driving by autonomously accelerate or decelerate according to the distances to the other automobiles in front or display a collision alert, etc.

Currently, most front radars for vehicles transmit electronic waves having a frequency of 77 GHz and receive the returning waves reflected off the other automobiles to calculate the distances to the other automobiles in front.

Thus, in order to minimize the occurrences of the waves transmitted from the vehicle's front radar being reflected off unintended targets other than the other automobiles in front, such as the body of the vehicle on which the radar is attached or the ground surface, mounting the vehicle front radar at the very front of the vehicle at a location above a certain height from the ground would be the most ideal.

Therefore, the most ideal position for mounting a front radar on an automobile is the exact center between the left and right headlights. While the structure of the automobile may vary according to the manufacturer and design, the position mentioned above is typically where the front radiator grill is located or, in some cases, where the automobile emblem attached to the grill is located.

The emblem of an automobile is a symbol representing the automobile manufacturer, displaying a unique shape, text, or logo for each manufacturer, and the front radiator grill may also differ in shape according to the automobile manufacturer and the model (lineup).

Although the shapes of the emblem and the radiator grill of an automobile may differ according to the manufacturer and model, in most cases the emblem and radiator grill of an automobile generally have the color of a silver shade as well as the texture, touch, and shine of a metal, for homogeneity with the automobile body. For this, the unique shapes may be formed using a non-metal component such as plastic or rubber as a base material and plating the surfaces of the shapes with chromium.

Thus, if the front radar of a vehicle is mounted on the back surface of a conventional automobile emblem or front radiator grill, the waves of the vehicle radar would be transmitted and received through the emblem or radiator grill, and as the wave propagation performance of the radar is affected by the metallic chromium plating layer of the conventional automobile emblem or front radiator grill, the overall performance of the vehicle radar may also be drastically lowered.

Therefore, there is a need for an automobile emblem, and a method of manufacturing the automobile emblem, that has a silver luster of a metallic texture in the same manner as the chromium plating applied to the conventional automobile emblem and radiator grill and is formed with a base material and a paint having non-metal components so as not to affect the radiative performance of a vehicle front radar mounted on the back surface of the emblem or radiator grill.

SUMMARY OF THE INVENTION

An objective of the present invention is to provide an emblem for an automobile, and a method of manufacturing the automobile emblem, where the automobile emblem has a metallic texture and a silver luster but does not hinder the reception of waves for an automobile front radar.

A method of manufacturing an automobile emblem according to an embodiment of the invention may be for manufacturing an emblem that is to be disposed on a front surface of an automobile and represents a particular shape, and the method may include: a first step of applying injection molding on a polyester-based resin to provide a first processed object; a second step of annealing the first processed object under a condition of a first temperature to provide a second processed object; a third step of coating the second processed object with a first coating material, which may include a UV resin or an epoxy-based resin, to provide a third processed object; a fourth step of irradiating UV rays with a first dose such that the first coating material of the third processed object is hardened to provide a fourth processed object; a fifth step of sputtering a metal-color paint such that the metal-color paint is deposited on a surface of the fourth processed object to provide a fifth processed object; a sixth step of laser etching one side of the fifth processed object into the particular shape to provide a sixth processed object; a seventh step of applying black-painting on the sixth processed object with a first paint to provide a seventh processed object; an eighth step of applying adhesion-painting on the seventh processed object with a second paint to provide an eighth processed object; a ninth step of applying insert molding on the eighth processed object with a polyvinyl-based resin to provide a ninth processed object;

a tenth step of coating the ninth processed object with a second coating material, which may include a UV resin or an epoxy-based resin, to provide a tenth processed object; and an eleventh step of irradiating UV rays with a second dose such that the second coating material of the tenth processed object is hardened to provide the automobile emblem.

In a method of manufacturing an automobile emblem according to an embodiment of the invention, the first step can include step no. 1-1 of applying transfer molding on the polyester-based resin to provide a processed object no. 1-1, and step no. 1-2 of drying processed object no. 1-1. Step no. 1-1 can include manufacturing processed object no. 1-1 by way of a first molding cast, which may include a first upper cast and a first lower cast that form a first holding space and a first injection space that connects with the first holding space. The first upper cast can be maintained at a temperature of 135 to 145° C., the first lower cast can be maintained at a temperature of 75 to 85° C., the first upper cast and the first lower cast can be pressed together with a pressure of 1200 to 1300 kgf/cm$^2$, the first injection space can be maintained at a temperature of 60 to 70° C., and processed object no. 1-1 can be manufactured by transfer molding as the polyester-based resin is transported from the first holding space into the first injection space.

In a method of manufacturing an automobile emblem according to an embodiment of the invention, the polyester-based resin can include any one of polyethylene terephthalate (PET), polybutylene terephthalate (PBT), polycarbonate (PC), and polyarylate (PAR).

In a method of manufacturing an automobile emblem according to an embodiment of the invention, step no. 1-2 can include drying processed object no. 1-1 for 1 to 2 hours at 115 to 125° C.

In a method of manufacturing an automobile emblem according to an embodiment of the invention, step no. 1-1 can further include keeping processed object no. 1-1 at a pressure of 900 to 950 kgf/cm$^2$.

In a method of manufacturing an automobile emblem according to an embodiment of the invention, the second step can include: step no. 2-1 of annealing for 15 to 20 minutes at the first temperature; and step no. 2-2 of cooling for 10 minutes at a temperature of 25 to 35° C., where the first temperature can be from 30 to 40° C.

In a method of manufacturing an automobile emblem according to an embodiment of the invention, in the third step, the first coating material can have a viscosity of 11 to 13 g/cm·s, and a spraying device for spraying the first coating material onto a surface of the second processed object can have an ejection pressure of 1.2 to 1.4 bar, a misting pressure of 1.9 to 2.1 bar, and a pattern pressure of 0.5 to 0.7 bar.

In a method of manufacturing an automobile emblem according to an embodiment of the invention, the fourth step can include: step no. 4-1 of preheating the third processed object for 3 to 5 minutes at 60 to 80° C. to provide processed object no. 4-1; step no. 4-2 of irradiating the UV rays with the first dose onto processed object no. 4-1 to provide processed object no. 4-2; step no. 4-3 of irradiating IR rays onto processed object no. 4-2 for 5 to 10 minutes at 28 to 32° C. to provide processed object no. 4-3; and step no. 4-4 of cooling processed object no. 4-3 at 20 to 25° C. to provide processed object no. 4-4, where the first dose can be 750 to 850 mJ/cm$^2$.

In a method of manufacturing an automobile emblem according to an embodiment of the invention, the fifth step can include sputtering the metal-color paint onto a surface of the fourth processed object while maintaining a flow of argon gas at a first flow rate and under a condition of a DC power of 2.4 kW.

In a method of manufacturing an automobile emblem according to an embodiment of the invention, the first flow rate can be 25 to 27 sccm, and the metal-color paint can be deposited on the surface of the fourth processed object for a duration of 3 seconds.

In a method of manufacturing an automobile emblem according to an embodiment of the invention, the seventh step can include: step no. 7-1 of applying black-painting on a surface of the sixth processed object with the first paint by way of a spraying device to provide processed object no. 7-1; and step no. 7-2 of drying processed object no. 7-1 for 25 to 30 minutes at a temperature of 60 to 80° C.

In a method of manufacturing an automobile emblem according to an embodiment of the invention, in step no. 7-1, the first paint can have a viscosity of 13 to 15 g/cm·s, and a spraying device for spraying the first paint onto a surface of the sixth processed object can have an ejection pressure of 0.8 to 1.0 bar, a misting pressure of 0.7 to 0.9 bar, and a pattern pressure of 1.3 to 1.5 bar.

In a method of manufacturing an automobile emblem according to an embodiment of the invention, processed object no. 7-1 can have the first painted coated in a thickness of 20 to 50 μm.

In a method of manufacturing an automobile emblem according to an embodiment of the invention, the eighth step can include: step no. 8-1 of applying adhesion-painting on a surface of the seventh processed object with the second paint by way of a spraying device to provide processed object no. 8-1; and step no. 8-2 of drying processed object no. 8-1 for 25 to 30 minutes at 50 to 60° C.

In a method of manufacturing an automobile emblem according to an embodiment of the invention, in step no. 8-1, the second paint can have a viscosity of 14 to 16 g/cm·s, and a spraying device for spraying the second paint onto a surface of the seventh processed object can have an ejection pressure of 1.7 to 1.8 bar, a misting pressure of 1.9 to 2.1 bar, and a pattern pressure of 0.8 to 1.0 bar.

In a method of manufacturing an automobile emblem according to an embodiment of the invention, the second paint can be configured to improve adhesion between the seventh processed object and the polyvinyl-based resin during the insert molding of the seventh processed object and the polyvinyl-based resin.

In a method of manufacturing an automobile emblem according to an embodiment of the invention, the ninth step can include: step no. 9-1 of preheating the eighth processed object at a second temperature to provide processed object no. 9-1, step no. 9-2 of applying transfer molding on processed object no. 9-1 with the polyvinyl-based resin to provide processed object no. 9-2, and step no. 9-3 of drying processed object no. 9-2.

In a method of manufacturing an automobile emblem according to an embodiment of the invention, step no. 9-2 can include: manufacturing processed object no. 9-2 by way of a second molding cast, which may include a second upper cast and a second lower cast that provide a second holding space and a second injection space that connects with the second holding space, where the second upper cast can be maintained at a temperature of 55 to 65° C., the second lower cast can be maintained at a temperature of 50 to 60° C., the second upper cast and the second lower cast can be pressed together with a pressure of 2900 to 3100 kgf/cm$^2$, the second injection space can be maintained at a temperature of 50 to 60° C., and processed object no. 9-2 can be manufactured by transfer molding as the polyvinyl-based resin is transported from the second holding space into the second injection space.

In a method of manufacturing an automobile emblem according to an embodiment of the invention, the polyvinyl-based resin can include any one of polyvinyl chloride (PVC), polyvinylidene chloride (PVDC), polyvinyl acetate (PVAC), polyvinyl alcohol (PVAL), polyvinyl acetals, polystyrene (PS), AS resins, ABS resins, poly(methyl methacrylate) (PMMA), and fluorine resins.

In a method of manufacturing an automobile emblem according to an embodiment of the invention, step no. 9-1 can include preheating the eighth processed object for 60 to 70 minutes at 60 to 80° C.

In a method of manufacturing an automobile emblem according to an embodiment of the invention, step no. 9-2 can further include keeping processed object no. 9-2 at a pressure of 500 to 530 kgf/cm$^2$.

In a method of manufacturing an automobile emblem according to an embodiment of the invention, step no. 9-3 can include drying processed object no. 9-2 for 1 to 2 hours at 85 to 95° C.

In a method of manufacturing an automobile emblem according to an embodiment of the invention, in the tenth step, the second coating material can have a viscosity of 11 to 13 g/cm·s, and a spraying device for spraying the second coating material onto a surface of the ninth processed object can have an ejection pressure of 0.8 to 0.9 bar, a misting pressure of 0.7 to 0.9 bar, and a pattern pressure of 1.7 to 1.9 bar.

In a method of manufacturing an automobile emblem according to an embodiment of the invention, the eleventh step can include: step no. 11-1 of preheating the tenth processed object for 3 to 5 minutes at 60 to 80° C. to provide processed object no. 11-1; step no. 11-2 of irradiating the UV rays with the second dose onto processed object no. 11-1 to provide processed object no. 11-2; step no. 11-3 of irradiating IR rays onto processed object no. 11-2 for 7 to 9 minutes at 55 to 60° C. to provide processed object no. 11-3; and step no. 11-4 of cooling processed object no. 11-3 at 20 to 25° C. to provide the automobile emblem, and the second dose can be 2900 to 3100 mJ/cm$^2$.

An automobile emblem according to an embodiment of the invention can be manufactured by the method described above and can be manufactured to have a metallic texture and a silver luster without hindering the reception of the electromagnetic waves of a vehicle front radar.

According to an embodiment of the invention, the chromium plating commonly applied in automobile emblems and radiator grills of the related art to provide a metallic feel is not used, so that the lowering of the radiative performance of the vehicle front radar caused by the chromium plating layer of the automobile emblem or radiator grill can be avoided.

Also, as it is possible to mount a vehicle front radar on the back surface of the emblem positioned at the exact center on the front surface of an automobile or on the back surface of the front radiator grill, the vehicle front radar can be mounted in an optimal position to provide maximum performance.

Also, as the vehicle front radar is mounted to be hidden behind the automobile emblem or the front radiator grill, an aesthetically more pleasing automobile design can be achieved compared to the conventional automobile having an exposed vehicle radar.

Additional aspects and advantages of the present invention will be set forth in part in the description which follows, and in part will be obvious from the description, or may be learned by practice of the invention.

DETAILED DESCRIPTION OF THE INVENTION

Figure 1:
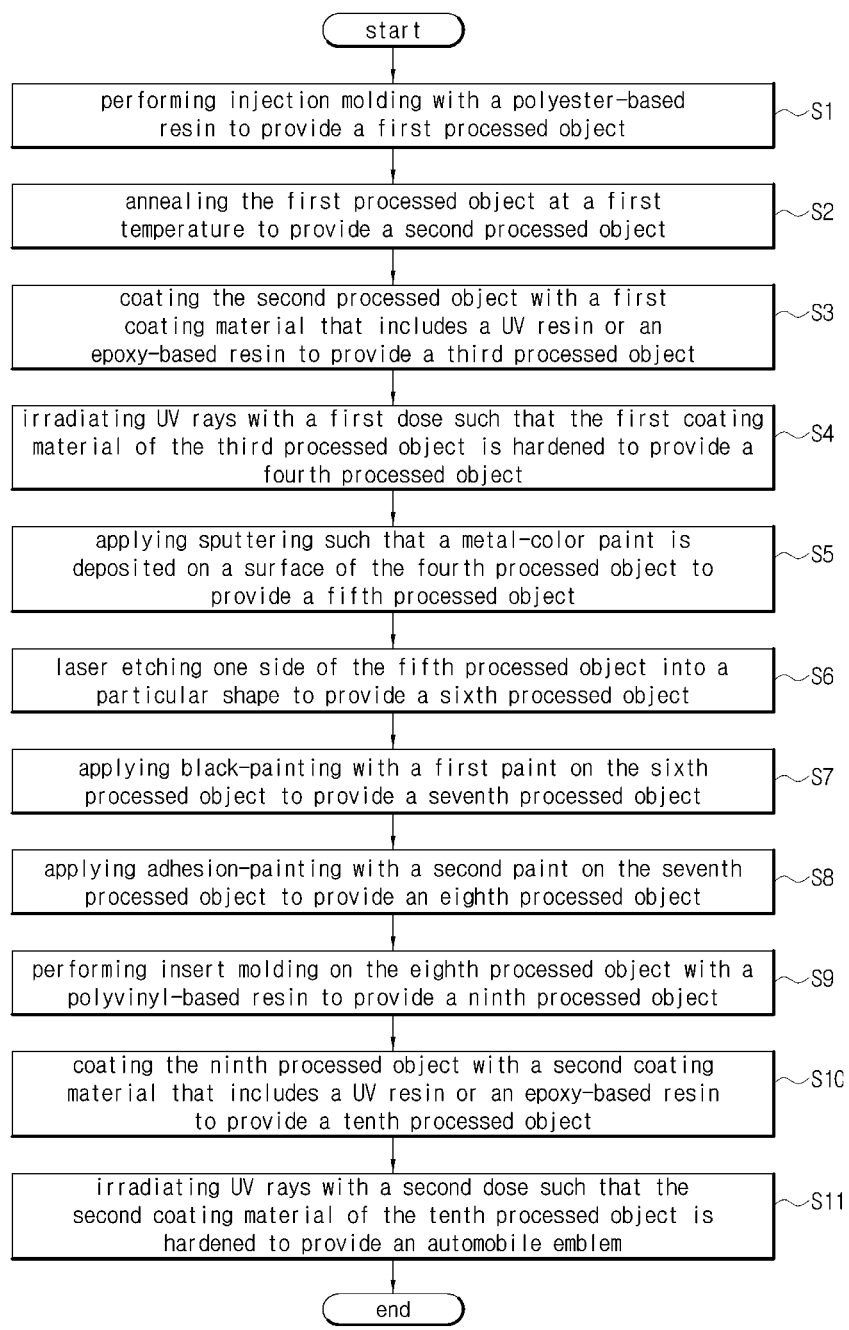
FIG. 1 is a flowchart illustrating a method of manufacturing an automobile emblem according to an embodiment of the invention.

A specific embodiment of the present invention is described below with reference to the accompanying drawings. However, the spirit of the invention is not to be limited by the embodiment presented herein, and while a skilled person understanding the spirit of the invention would be able to readily propose a less inventive implementation or other embodiments that are encompassed within the scope of the present inventive spirit by adding, modifying, or omitting certain components within the scope of the same inventive spirit, it should be appreciated that such implementations and embodiments remain within the scope of the present inventive spirit.

Elements having the same function within the scope of the same concept shown in the drawings for each embodiment are described using the same reference numerals.

Figure 2:
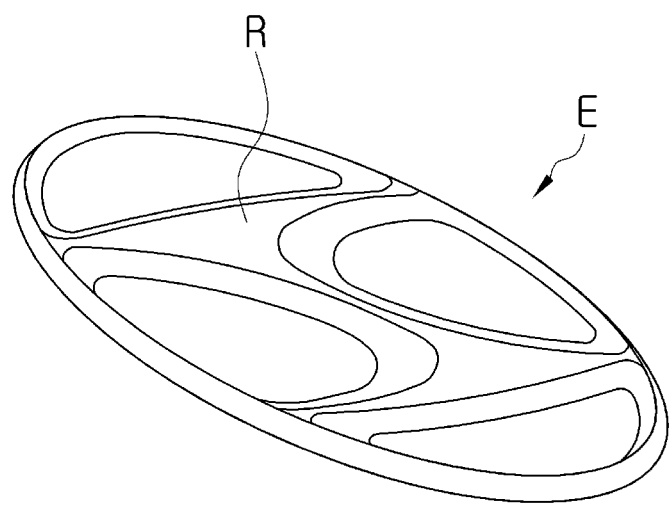
FIG. 2 is a perspective view conceptually illustrating an automobile emblem manufactured by a method of manufacturing an automobile emblem according to an embodiment of the invention.
Figure 3A:
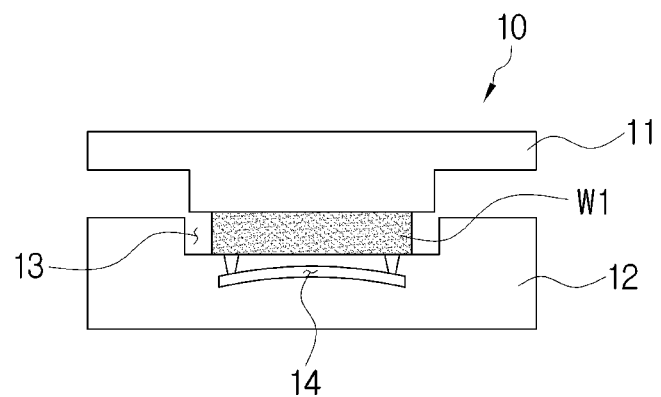
FIGS. 3A to 3D conceptually illustrate a first step in a method of manufacturing an automobile emblem according to an embodiment of the invention.
Figure 3B:
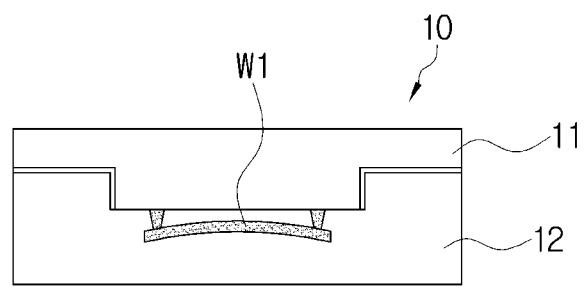
Figure 3C:
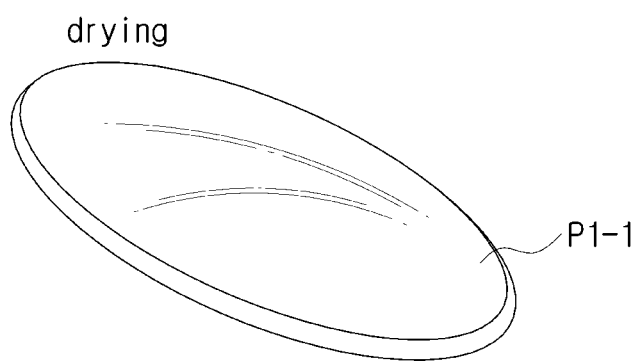
Figure 3D:
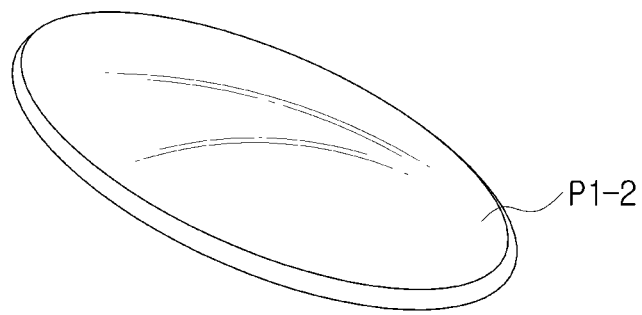
Figure 4A:
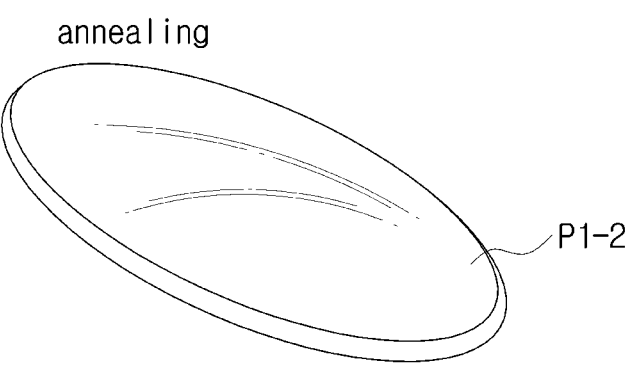
FIGS. 4A to 4D conceptually illustrate a second step in a method of manufacturing an automobile emblem according to an embodiment of the invention.
Figure 4B:
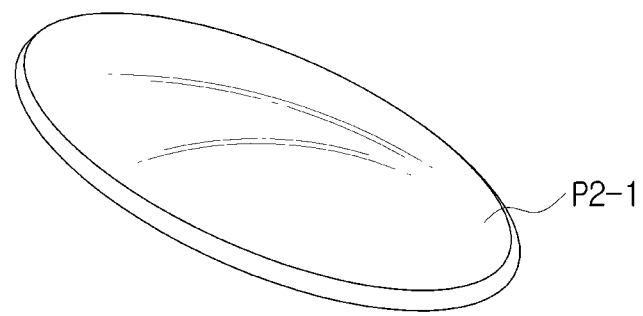
Figure 4C:
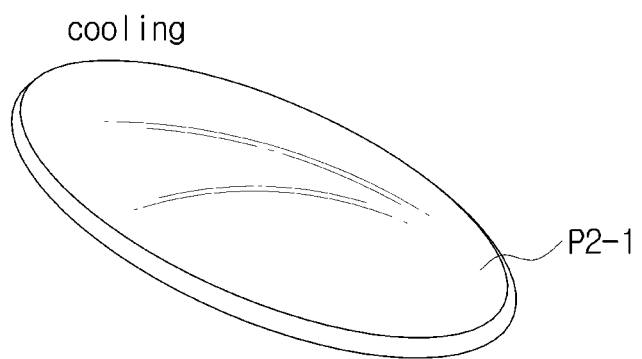
Figure 4D:
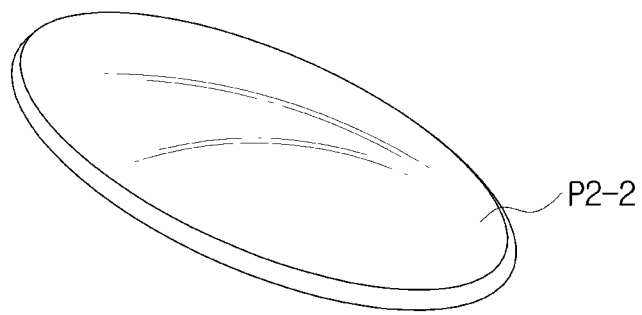

FIG. 1 is a flowchart illustrating a method of manufacturing an automobile emblem according to an embodiment of the invention, and FIG. 2 is a perspective view conceptually illustrating an automobile emblem manufactured by a method of manufacturing an automobile emblem according to an embodiment of the invention.

Also, FIGS. 3A to 16D conceptually illustrate the steps of a method of manufacturing an automobile emblem according to an embodiment of the invention.

Referring to FIG. 1 and FIG. 2, a method of manufacturing an automobile emblem according to an embodiment of the invention can be a method of manufacturing an automobile emblem E that is disposed on the front of an automobile to represent a particular shape R.

The particular shape R may serve as a seal that represents a particular company or organization in a simple manner by means of shapes, characters, or a combination thereof that represent the name, mark, logo, etc., of the company or organization.

An automobile emblem E manufactured by a manufacturing method according to an embodiment of the invention is an object that is formed in a particular shape R and attached to the surface or exterior of a product provided by a manufacturer so as to let consumers know that the product is from said manufacturer.

A method of manufacturing an automobile emblem according to an embodiment of the invention can be implemented by sequentially performing a first step S1 through an eleventh step S11.

A description is provided below of the chronological progression from the first step S1 to the eleventh step S11.

Referring to FIGS. 3A to 3D, the first step S1 can be a step of applying injection molding on a polyester-based resin W1 to provide a first processed object P1.

More specifically, the first step S1 can include step no. 1-1 of applying transfer molding on the polyester-based resin W1 to provide a processed object P1-1 and step no. 1-2 of drying the processed object P1-1.

Step no. 1-1 can be implemented by a first molding cast 10, which may include a first upper cast 11 and a first lower cast 12 that form a first holding space 13 and a first injection space 14 that connects with the first holding space 13.

The polyester-based resin W1 can be injected into the first injection space 14 from the first holding space 13 provided by the first upper cast 11 and the first lower cast 12 and can then undergo transfer molding between the first upper cast 11 and first lower cast 12 and the first injection space 14, which have been heated to preset temperatures.

Here, transfer molding refers to a type of injection molding that involves applying a vacuum pressure at one side of a molding space and applying an injection pressure at the other side of the molding space, so that the molded resin is transported by the pressure into the molding space.

The first upper cast 11 can be maintained at 135 to 145° C., and the first lower cast 12 can be maintained at 75 to 85° C.

Also, the first upper cast 11 and the first lower cast 12 can provide a pressure of 1200 to 1300 kgf/cm$^2$ and can preferably be pressed together with a pressure of 1200 kgf/cm$^2$ for implementing the injection molding of the polyester-based resin W1.

Also, the temperature of the first injection space 14 can be maintained at 60 to 70° C., preferably 65° C.

The polyester-based resin W1 can include any one of polyethylene terephthalate (PET), polybutylene terephthalate (PBT), polycarbonate (PC), and polyarylate (PAR).

Step no. 1-1 can further include keeping the processed object P1-1 at a pressure of 900 to 950 kgf/cm$^2$.

This step of maintaining pressure can be a step of maintaining the filling pressure for a duration of time after the injection filling of the processed object P1-1 molded by the first molding cast 10 and can be for compensating the volume decrease resulting from compression as the processed object P1-1 is cooled.

Step no. 1-2 can be a step of drying the processed object P1-1 for 1 to 2 hours at 115 to 125° C., and step no. 1-2 can provide a processed object P1-2.

Here, the processed object P1-2 can refer to the first processed object P1 described above.

Referring to FIGS. 4A to 4D, the second step S2 can be a step of annealing the first processed object P1 under the condition of a first temperature to provide a second processed object P2.

More specifically, the second step S2 can include step no. 2-1 of annealing the first processed object P1 for 15 to 20 minutes at the first temperature to provide a processed object P2-1 and step no. 2-2 of cooling the processed object P2-1 for 10 minutes at a temperature of 25 to 35° C. to provide a processed object P2-2.

Here, the first temperature can be from 30 to 40° C., preferably 36° C., and the annealing can be performed preferably for 18 minutes.

The annealing refers to a heat treatment of gradually cooling the processed object P1-2 that has been dried at a high temperature in step no. 1-2. Such an annealing heat treatment can be for: firstly, removing any remaining stresses in the processed object; secondly, improving ductility and toughness; and thirdly, forming a specific microstructure.

The processed object P2-2 can refer to the second processed object P2 produced by the second step S2 described above.

Figure 5A:
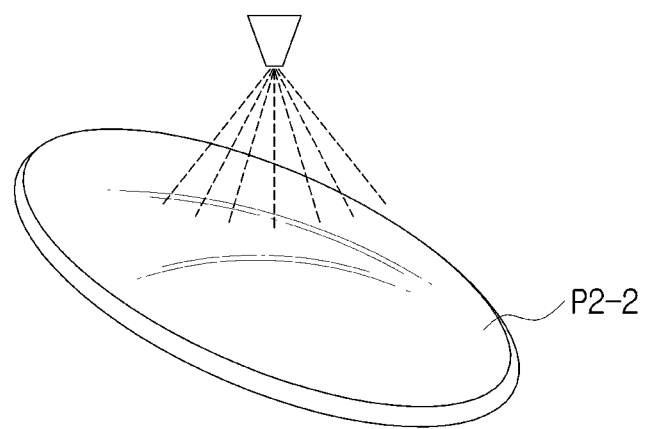
FIGS. 5A and 5B conceptually illustrate a third step in a method of manufacturing an automobile emblem according to an embodiment of the invention.
Figure 5B:
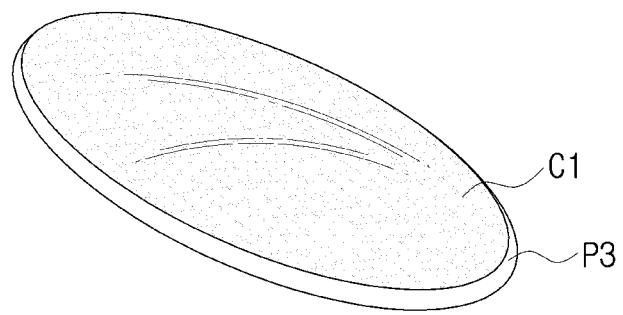
Figure 6A:
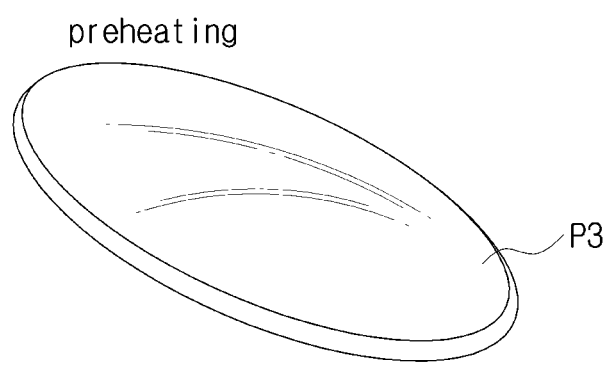
FIGS. 6A to 6D and FIGS. 7A to 7D conceptually illustrate a fourth step in a method of manufacturing an automobile emblem according to an embodiment of the invention.
Figure 6B:
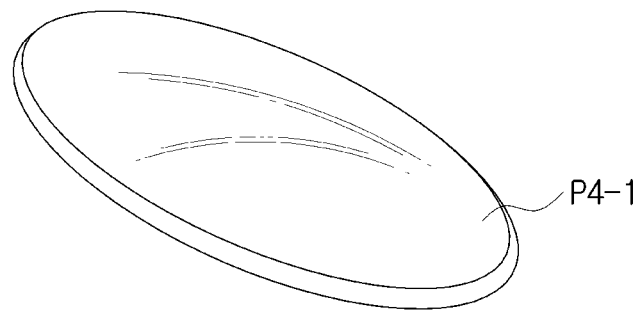
Figure 6C:
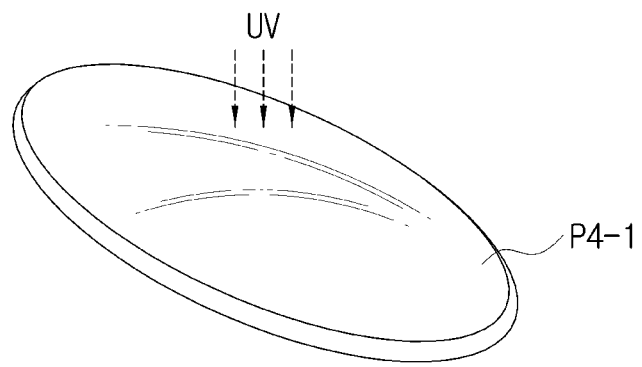
Figure 6D:
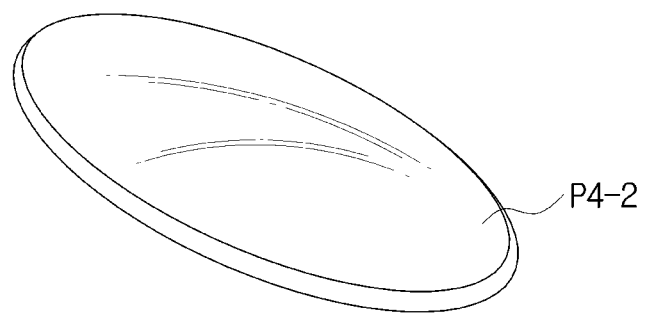
Figure 7A:
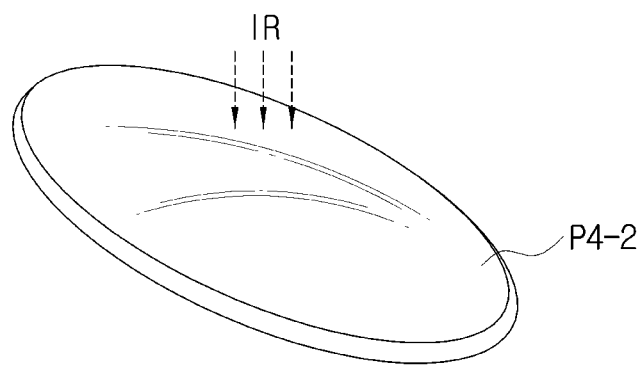
Figure 7B:
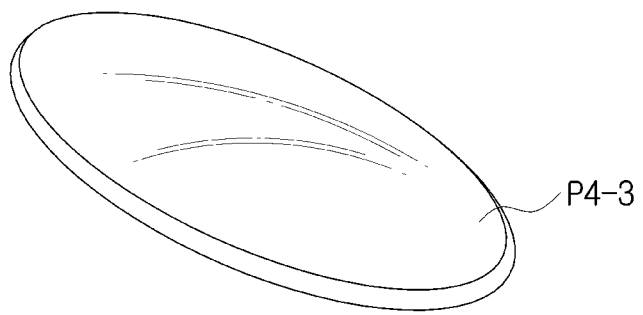
Figure 7C:
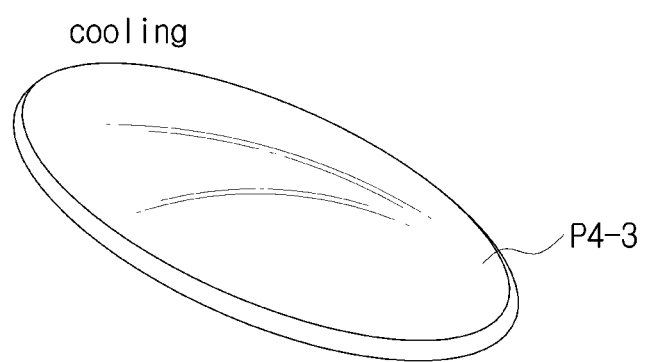
Figure 7D:
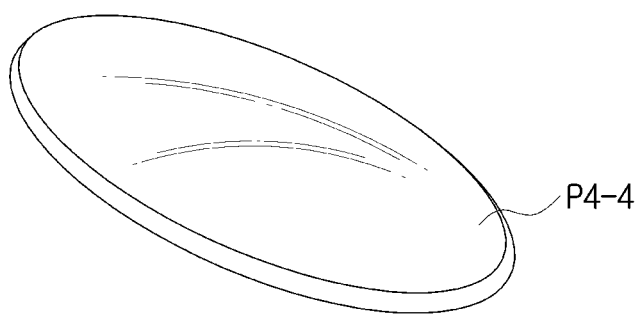

Referring to FIGS. 5A and 5B, the third step S3 can be a step of coating the second processed object P2 with a first coating material C1, which may include a UV resin or an epoxy-based resin, to provide a third processed object P3.

The first coating material C1 can have a viscosity of 11 to 13 g/cm·s, preferably 12 g/cm·s.

Also, the spraying device for spraying the first coating material C1 onto a surface of the second processed object P2 can have an ejection pressure of 1.2 to 1.4 bar, preferably 1.3 bar.

The misting pressure of the spraying device can be 1.9 to 2.1 bar, preferably 2.0 bar, and the pattern pressure of the spraying device can be 0.5 to 0.7 bar, preferably 0.6 bar.

Here, the spraying device can be a type of coating robot.

Referring to FIGS. 6A to 6D and FIGS. 7A to 7D, the fourth step S4 can be a step of irradiating UV rays with a first dose such that the first coating material C1 of the third processed object P3 is hardened to provide a fourth processed object P4.

More specifically, the fourth step S4 can include: step no. 4-1 of preheating the third processed object P3 for 3 to 5 minutes at 60 to 80° C. to provide a processed object P4-1, step no. 4-2 of irradiating the UV (ultraviolet) rays with the first dose onto the processed object P4-1 to provide a processed object P4-2, step no. 4-3 of irradiating IR (infrared) rays onto the processed object P4-2 for 5 to 10 minutes at 28 to 32° C. to provide a processed object P4-3, and step no. 4-4 of cooling the processed object P4-3 at 20 to 25° C. to provide a processed object P4-4.

Here, the first dose can be 750 to 850 mJ/cm$^2$.

Also, the processed object P4-4 can refer to the fourth processed object P4 described above.

Figure 8A:
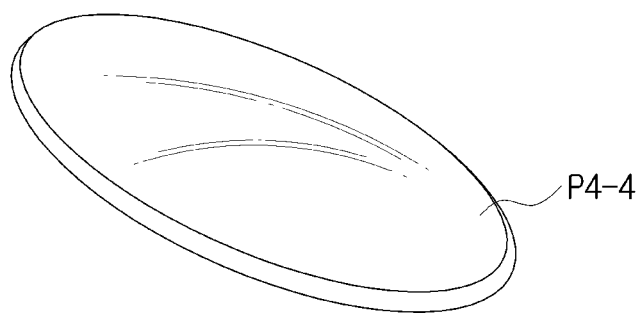
FIGS. 8A and 8B conceptually illustrate a fifth step in a method of manufacturing an automobile emblem according to an embodiment of the invention.
Figure 8B:
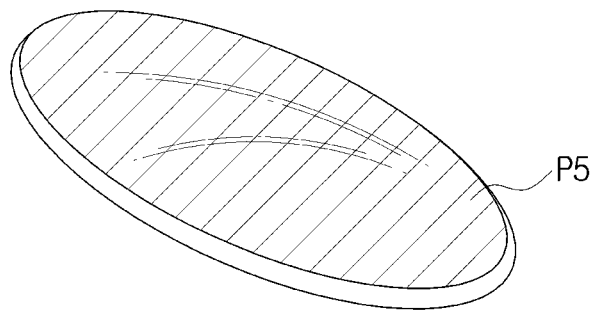

Referring to FIGS. 8A and 8B, the fifth step S5 can be a step of sputtering a metal-color paint such that the metal-color paint is deposited on a surface of the fourth processed object P4 to provide a fifth processed object P5.

More specifically, the fifth step S5 can include sputtering the metal-color paint onto a surface of the fourth processed object P4 while maintaining a flow of argon gas at a first flow rate and under a DC power of 2.4 kW.

Here, the first flow rate can be 25 to 27 sccm, preferably 26 sccm.

Also, the duration of depositing the metal-color paint on the surface of the fourth processed object P4 can be 3 seconds.

Figure 9A:
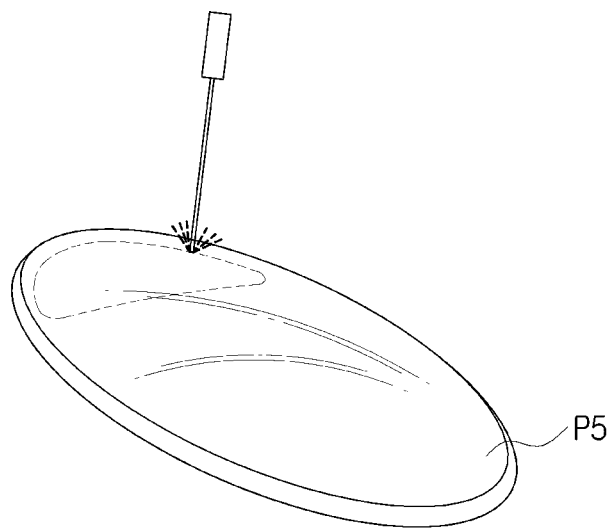
FIGS. 9A and 9B conceptually illustrate a sixth step in a method of manufacturing an automobile emblem according to an embodiment of the invention.
Figure 9B:
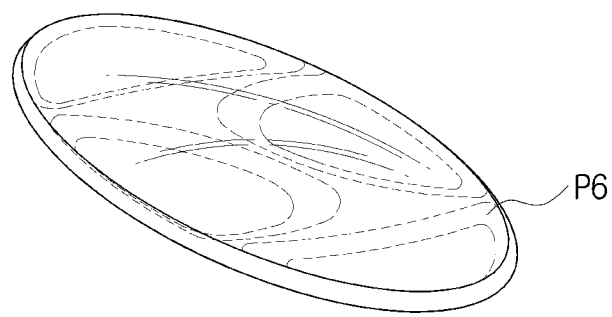
Figure 10A:
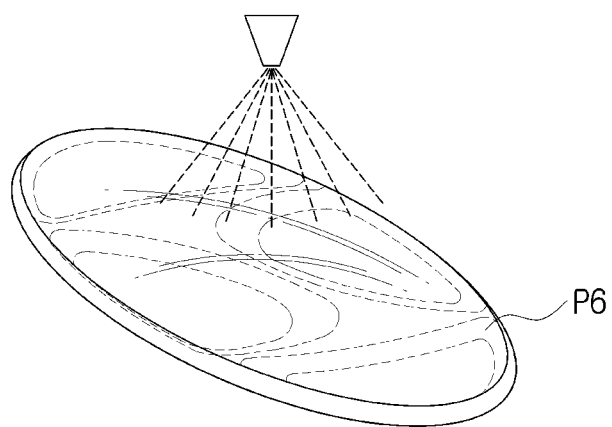
FIGS. 10A to 10D conceptually illustrate a seventh step in a method of manufacturing an automobile emblem according to an embodiment of the invention.
Figure 10B:
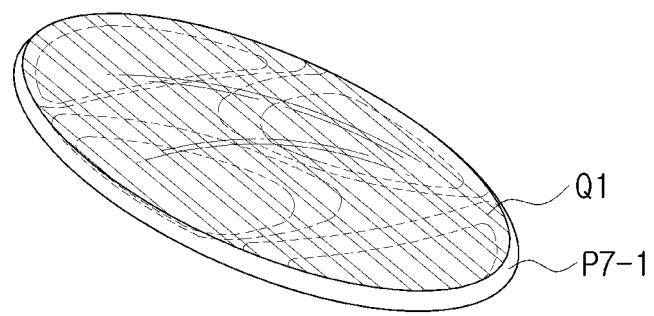
Figure 10C:
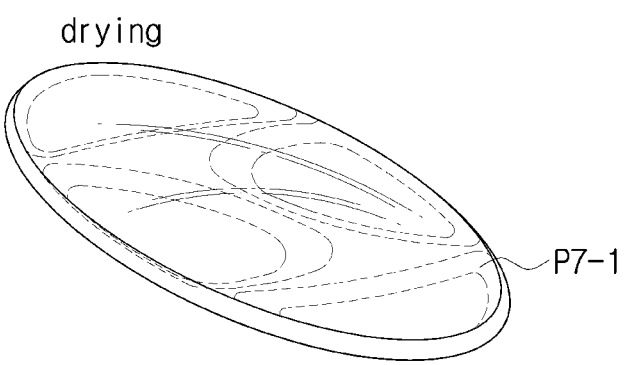
Figure 10D:
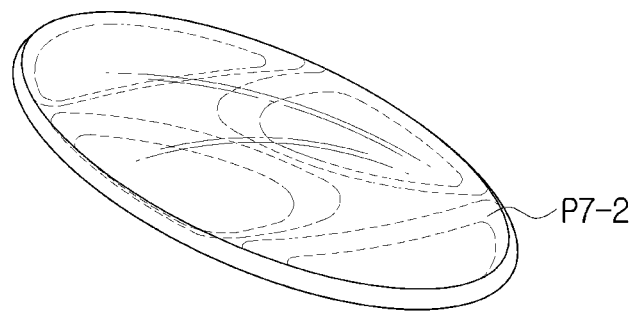
Figure 11A:
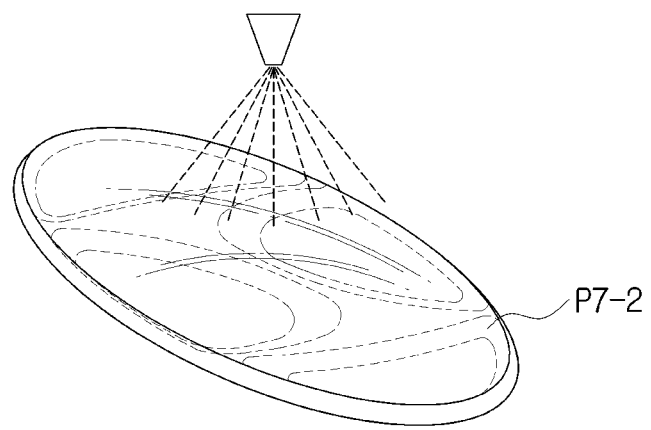
FIGS. 11A to 11D conceptually illustrate an eighth step in a method of manufacturing an automobile emblem according to an embodiment of the invention.
Figure 11B:
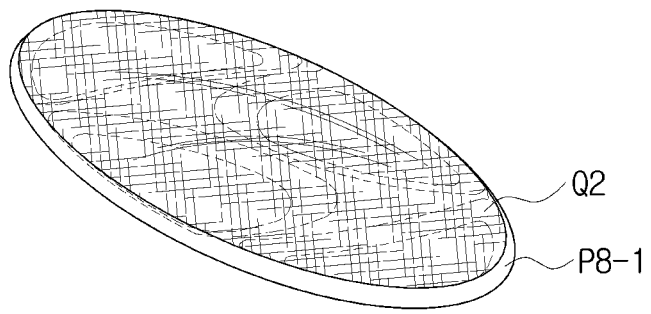
Figure 11C:
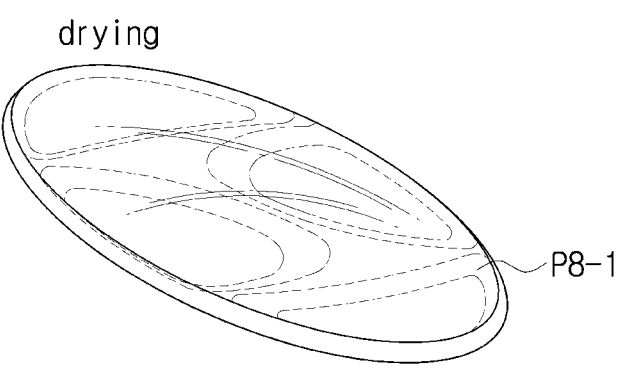
Figure 11D:
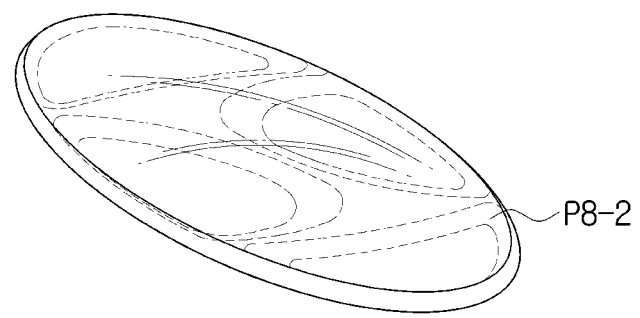
Figure 12A:
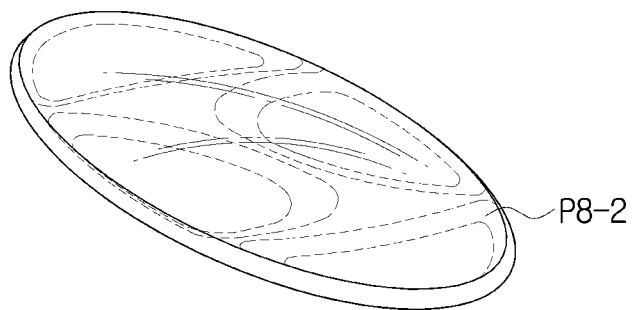
FIGS. 12A and 12B and FIGS. 13A to 13D conceptually illustrate a ninth step in a method of manufacturing an automobile emblem according to an embodiment of the invention.
Figure 12B:
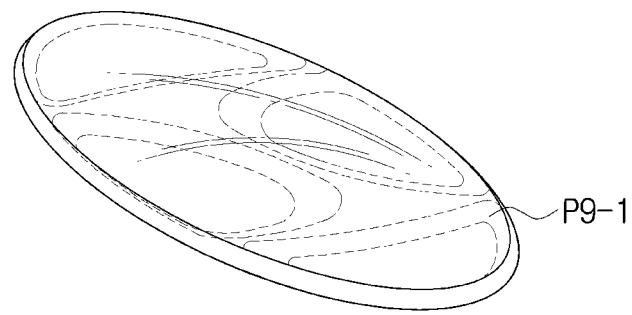
Figure 13A:
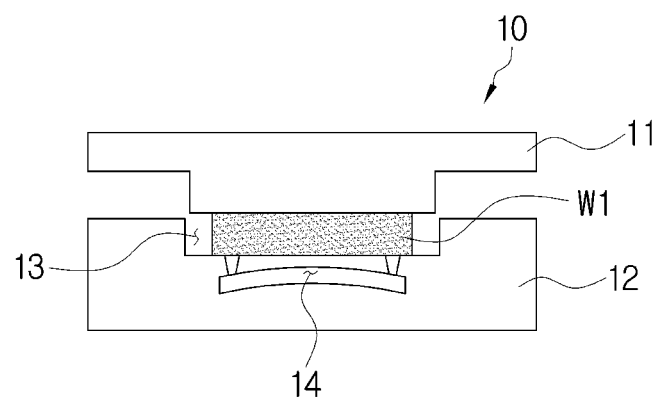
Figure 13B:
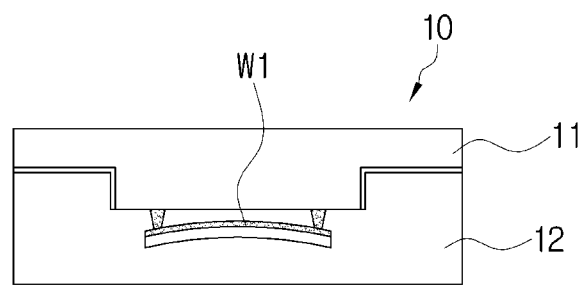
Figure 13C:
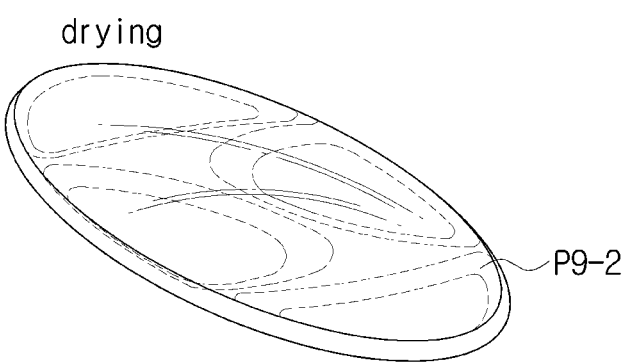
Figure 13D:
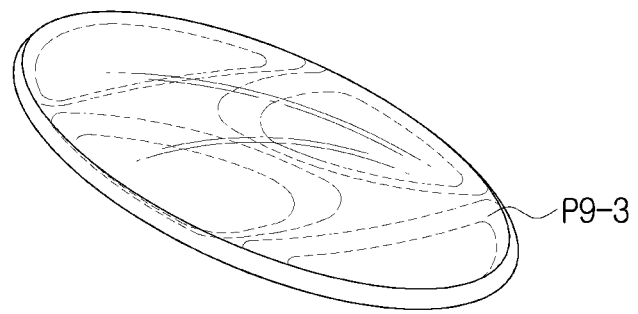

Referring to FIGS. 9A and 9B, the sixth step S6 can be a step of laser etching one side of the fifth processed object P5 into the particular shape R to provide a sixth processed object P6.

Referring to FIGS. 10A to 10D, the seventh step S7 can be a step of applying black-painting on the sixth processed object P6 with a first paint Q1 to provide a seventh processed object P7.

More specifically, the seventh step S7 can include step no. 7-1 of applying black-painting on a surface of the sixth processed object P6 with the first paint Q1 by way of a spraying device to provide a processed object P7-1 and step no. 7-2 of drying the processed object P7-1 for 25 to 30 minutes at a temperature of 60 to 80° C. to provide a processed object P7-2.

Here, the processed object P7-2 can refer to the seventh processed object P7 described above.

The first paint can have a viscosity of 13 to 15 g/cm·s, preferably 14 g/cm·s.

Also, the spraying device for spraying the first paint Q1 onto a surface of the sixth processed object P6 can have an ejection pressure of 0.8 to 1.0 bar, preferably 1.9 bar.

Also, the misting pressure of the spraying device can be 0.7 to 0.9 bar, preferably 0.8 bar.

Also, the pattern pressure of the spraying device can be 1.3 to 1.5 bar, preferably 1.4 bar.

With the processed object P7-1 coated by the first paint Q1 to a thickness of 20 to 50 μm, a surface of the processed object P7-1 may be coated in a black color to provide shading to the particular shape R of the automobile emblem E, so that the particular shape R can be viewed with a visually more 3-dimensional effect.

Referring to FIGS. 11A to 11D, the eighth step S8 can be a step of applying adhesion-painting on the seventh processed object P7 with a second paint Q2 to provide an eighth processed object P8.

More specifically, the eighth step S8 can include step no. 8-1 of applying adhesion-painting on a surface of the seventh processed object P7 with the second paint Q2 by way of a spraying device to provide a processed object P8-1 and step no. 8-2 of drying the processed object P8-1 for 25 to 30 minutes at 50 to 60° C. to provide a processed object P8-2.

Here, the processed object P8-2 can refer to the eighth processed object P8 described above.

In step no. 8-1, the second paint Q2 can have a viscosity of 14 to 16 g/cm·s, preferably 15 g/cm·s.

Also, the spraying device for spraying the second paint Q2 onto a surface of the seventh processed object P7 can have an ejection pressure of 1.7 to 1.8 bar, preferably 1.75 bar.

The misting pressure of the spraying device can be 1.9 to 2.1 bar, preferably 2.0 bar, and the pattern pressure of the spraying device can be 0.8 to 1.0 bar, preferably 0.9 bar.

The second paint Q2 can be an adhesive paint that improves adhesion between the seventh processed object P7 and the polyvinyl-based resin W2 during the insert molding of the seventh processed object P7 and polyvinyl-based resin W2.

In other words, the adhesive paint can be interposed between the seventh processed object P7 and the polyvinyl-based resin W2 to increase adhesion between the polyvinyl-based resin W2 and the seventh processed object P7.

Referring to FIGS. 12A and 12B and FIGS. 13A to 13D, the ninth step S9 can be a step of applying insert molding on the eighth processed object P8 with a polyvinyl-based resin W2 to provide a ninth processed object P9.

More specifically, the ninth step S9 can include step no. 9-1 of preheating the eighth processed object P8 at a second temperature to provide a processed object P9-1, step no. 9-2 of applying transfer molding on the processed object P9-1 with the polyvinyl-based resin W2 to provide a processed object P9-2, and step no. 9-3 of drying the processed object P9-2 to provide a processed object P9-3.

Step no. 9-1 can be a step of preheating the eighth processed object P8 for 60 to 70 minutes at 60 to 80° C.

Step no. 9-2 can include manufacturing the processed object P9-2 by way of a second molding cast 20, which may include a second upper cast 21 and a second lower cast 22 that form a second holding space 23 and a second injection space 24 that connects with the second holding space 23.

The polyvinyl-based resin W2 can be injected into the second injection space 24 from the second holding space 23 provided by the second upper cast 21 and the second lower cast 22 and can then undergo transfer molding between the second upper cast 21 and second lower cast 22 and the second injection space 24, which have been heated to preset temperatures.

The temperature of the second upper cast 21 can be maintained at 55 to 65° C., and the temperature of the second lower cast 22 can be maintained at 50 to 60° C.

Also, the second upper cast 21 and the second lower cast 22 can provide a pressure of 2900 to 3100 kgf/cm$^2$ and can preferably be pressed together with a pressure of 3000 kgf/cm$^2$ for implementing the injection molding of the polyvinyl-based resin W2.

Also, the temperature of the second injection space 24 can be maintained at 50 to 60° C., preferably 55° C.

The polyvinyl-based resin W2 can include any one of polyvinyl chloride (PVC), polyvinylidene chloride (PVDC), polyvinyl acetate (PVAC), polyvinyl alcohol (PVAL), polyvinyl acetals, polystyrene (PS), AS resins, ABS resins, poly(methyl methacrylate) (PMMA), and fluorine resins.

The processed object P9-2 may be manufactured by transfer molding as the polyvinyl-based resin W2 is transported from the second holding space 23 to the second injection space 24.

Also, step no. 9-2 can further include keeping the processed object P9-2 at a pressure of 500 to 530 kgf/cm$^2$.

This step of maintaining pressure can be a step of maintaining the filling pressure for a duration of time after the injection filling of the processed object P9-2 molded by the second molding cast 20 and can be for compensating the volume decrease resulting from compression as the processed object P9-2 is cooled.

Step no. 9-3 can be a step of drying the processed object P9-2 for 1 to 2 hours at 85 to 95° C.

The processed object P9-3 obtained at step no. 9-3 can refer to the ninth processed object P9 described above.

Figure 14A:
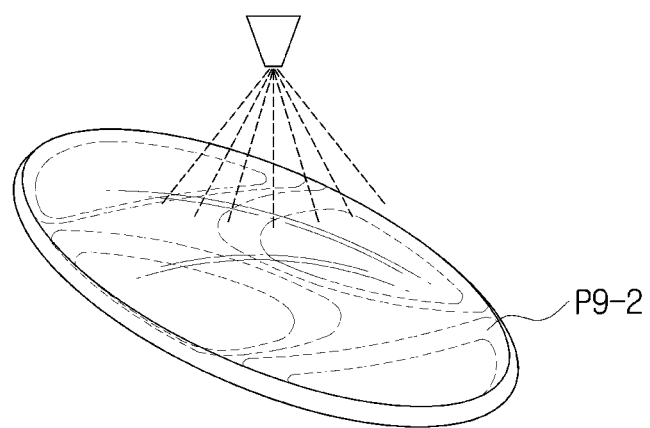
FIGS. 14A and 14B conceptually illustrate a tenth step in a method of manufacturing an automobile emblem according to an embodiment of the invention.
Figure 14B:
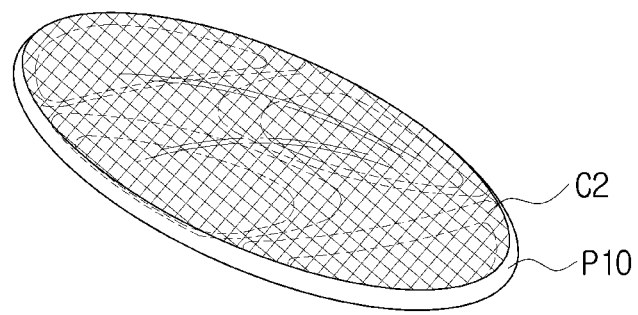
Figure 15A:
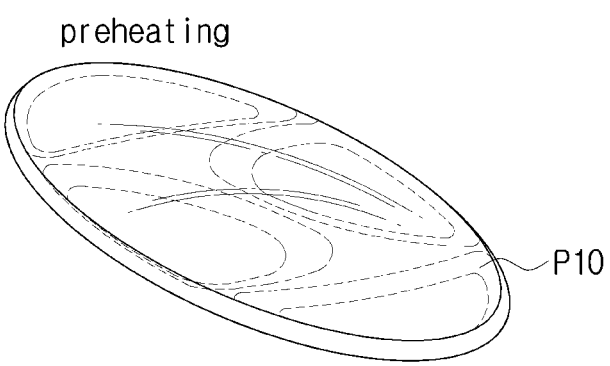
FIGS. 15A to 15D and FIGS. 16A to 16D conceptually illustrate an eleventh step in a method of manufacturing an automobile emblem according to an embodiment of the invention.
Figure 15B:
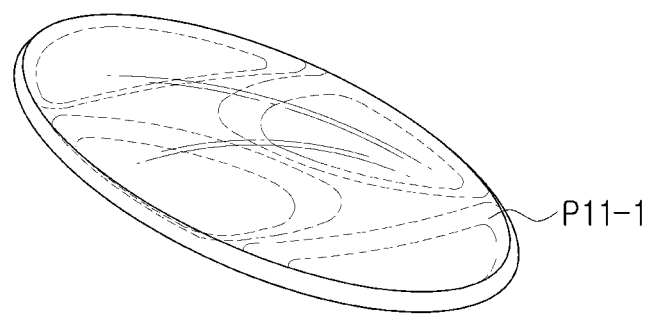
Figure 15C:
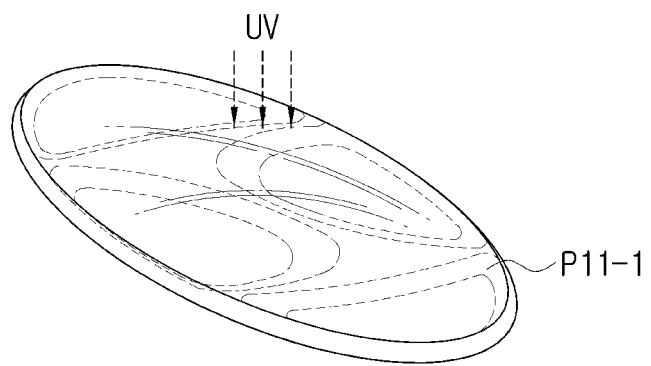
Figure 15D:
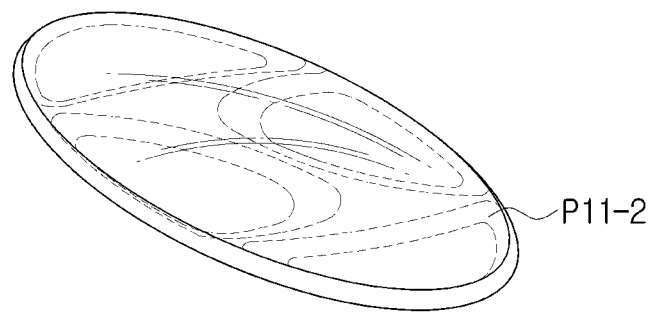
Figure 16A:
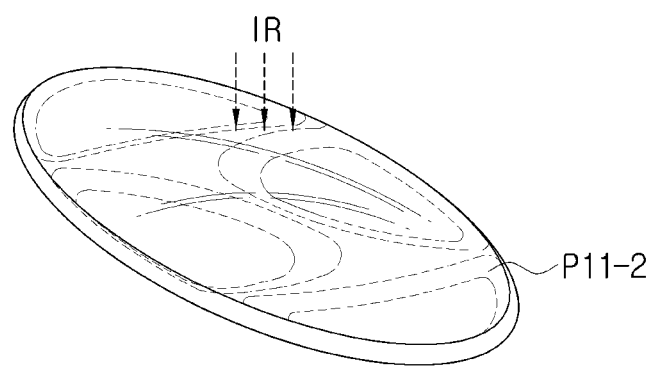
Figure 16B:
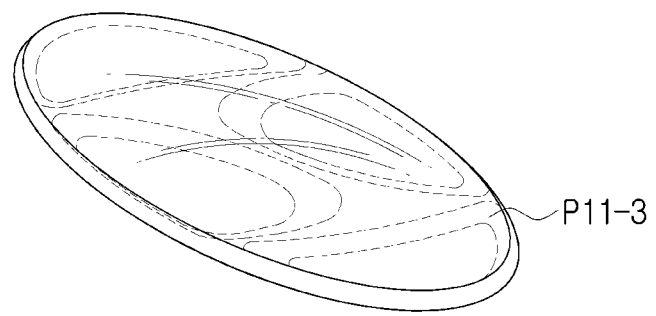
Figure 16C:
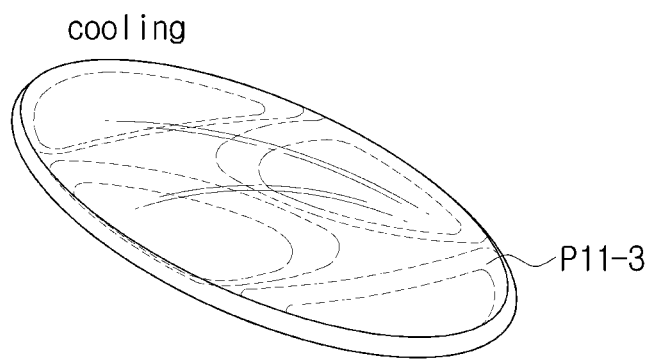
Figure 16D:
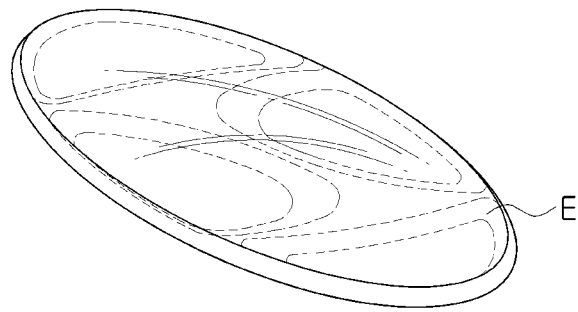

Referring to FIGS. 14A and 14B, the tenth step S10 can be a step of coating the ninth processed object P9 with a second coating material C2, which may include a UV resin or an epoxy-based resin, to provide a tenth processed object P10.

The second coating material C2 can have a viscosity of 11 to 13 g/cm·s, preferably 12 g/cm·s.

A spraying device for spraying the second coating material C2 onto a surface of the ninth processed object P9 can have an ejection pressure of 0.8 to 0.9 bar, preferably 0.85 bar.

Also, the misting pressure of the spraying device can be 0.7 to 0.9 bar, preferably 0.8 bar, and the pattern pressure of the spraying device can be 1.7 to 1.9 bar, preferably 1.8 bar.

Referring to FIGS. 15A to 15D and FIGS. 16A to 16D, the eleventh step S11 can be a step of irradiating UV rays with a second dose such that the second coating material C2 of the tenth processed object P10 is hardened to provide the automobile emblem E.

More specifically, the eleventh step S11 can include step no. 11-1 of preheating the tenth processed object P10 for 3 to 5 minutes at 60 to 80° C. to provide a processed object P11-1, step no. 11-2 of irradiating the UV rays with the second dose onto the processed object P11-1 to provide a processed object P11-2, step no. 11-3 of irradiating IR rays onto the processed object P11-2 for 7 to 9 minutes at 55 to 60° C. to provide a processed object P11-3, and step no. 11-4 of cooling the processed object P11-3 at 20 to 25° C. to provide the automobile emblem E.

The second dose can be 2900 to 3100 mJ/cm$^2$, preferably 3000 mJ/cm$^2$.

An automobile emblem E according to an embodiment of the invention can be manufactured by the method for manufacturing an automobile emblem described above.

Although the foregoing describes the elements and features of the present invention with reference to an embodiment of the invention, the present invention is not limited to or by the embodiment, and it is apparent to the person skilled in the field of art to which the invention pertains that various modifications or alterations are possible without departing from the spirit and scope of the invention. It should thus be understood that such modifications or alterations fall within the scope of the appended claims.

What is claimed is:

1. A method of manufacturing an automobile emblem, the automobile emblem configured to be disposed on a front surface of an automobile and representing a particular shape, the method comprising:
   transfer-molding a polyester-based resin and demolding to provide a first processed object;
   annealing the first processed object under a condition of a first temperature to provide a second processed object;
   coating an outward surface of the second processed object with a first coating material to provide a third processed object, the first coating material comprising a UV resin or an epoxy-based resin and directly contacting the outward surface of the polyester-based resin;
   irradiating UV rays with a first dose such that the first coating material of the third processed object is hardened to provide a fourth processed object;
   sputtering a metal-color paint on the first coating material such that the metal-color paint is deposited on an outward surface of the fourth processed object to provide a fifth processed object;
   laser etching the metal-color paint of the fifth processed object into the particular shape to provide a sixth processed object;
   applying black-painting on an outward surface of the sixth processed object with a first paint to provide a seventh processed object;
   applying adhesion-painting on an outward surface of the seventh processed object with a second paint to provide an eighth processed object;
   transfer-molding a polyvinyl-based resin directly on an outward surface of the adhesion-painting of the eighth processed object and demolding to provide a ninth processed object;
   coating an outward surface of the polyvinyl-based resin of the ninth processed object with a second coating material to provide a tenth processed object, the second coating material comprising a UV resin or an epoxy-based resin; and
   irradiating UV rays with a second dose such that the second coating material of the tenth processed object is hardened to provide the automobile emblem.

2. The method of manufacturing an automobile emblem according to claim 1, wherein said step of transfer-molding a polyester-based resin comprises:
   transfer-molding the polyester-based resin to provide a processed object no. 1-1; and
   drying said processed object no. 1-1,
   wherein said transfer-molding comprises:
      manufacturing said processed object no. 1-1 by way of a first mold comprising a first upper half mold and a first lower half mold, and a first cavity therebetween, the first upper half mold and the first lower half mold configured to provide a first holding space, and the first cavity connecting with the first holding space,
   wherein the first upper half mold is maintained at a temperature of 135 to 145° C.,
   wherein the first lower half mold is maintained at a temperature of 75 to 85° C.,
   where the first upper half mold and the first lower half mold are pressed together with a clamping pressure of 1200 to 1300 kgf/cm$^2$,
   wherein the first cavity is maintained at a temperature of 60 to 70° C., and
   wherein said processed object no. 1-1 is manufactured by transfer-molding as the polyester-based resin is transported from the first holding space into the first cavity.

3. The method of manufacturing an automobile emblem according to claim 2, wherein the polyester-based resin comprises any one of polyethylene terephthalate (PET), polybutylene terephthalate (PBT), polycarbonate (PC), and polyarylate (PAR).

4. The method of manufacturing an automobile emblem according to claim 2, wherein said step of drying said processed object no. 1-1 is performed for 1 to 2 hours at 115 to 125° C.

5. The method of manufacturing an automobile emblem according to claim 2, wherein said step of transfer-molding the polyester-based resin further comprises keeping said processed object no. 1-1 at a holding pressure of 900 to 950 kgf/cm$^2$.

6. The method of manufacturing an automobile emblem according to claim 1, wherein said step of annealing comprises:
   annealing for 15 to 20 minutes at the first temperature; and
   cooling for 10 minutes at a temperature of 25 to 35° C., and
   wherein the first temperature is from 30 to 40° C.

7. The method of manufacturing an automobile emblem according to claim 1, wherein the first coating material has a viscosity of 11 to 13 g/cm·s at room temperature, and
wherein a spraying device for spraying the first coating material onto the outward surface of the second processed object has an ejection pressure of 1.2 to 1.4 bar.

8. The method of manufacturing an automobile emblem according to claim 1, wherein said step of irradiating UV rays with a first dose comprises:
preheating the third processed object for 3 to 5 minutes at 60 to 80° C. to provide a processed object no. 4-1;
irradiating the UV rays with the first dose onto said processed object no. 4-1 to provide a processed object no. 4-2;
irradiating IR rays onto said processed object no. 4-2 for 5 to 10 minutes at 28 to 32° C. to provide a processed object no. 4-3; and
cooling said processed object no. 4-3 at 20 to 25° C. to provide a processed object no. 4-4, and
wherein the first dose is 750 to 850 mJ/cm$^2$.

9. The method of manufacturing an automobile emblem according to claim 1, wherein said step of sputtering comprises:
sputtering the metal-color paint onto the outward surface of the fourth processed object while maintaining a flow of argon gas at a first flow rate and under a condition of a DC power of 2.4 kW.

10. The method of manufacturing an automobile emblem according to claim 9, wherein the first flow rate is 25 to 27 sccm, and
wherein the metal-color paint is deposited on the outward surface of the fourth processed object for a duration of 3 seconds.

11. The method of manufacturing an automobile emblem according to claim 1, wherein said step of applying black-painting comprises:
applying black-painting on the outward surface of the sixth processed object with the first paint by way of a spraying device to provide a processed object no. 7-1; and
drying said processed object no. 7-1 for 25 to 30 minutes at a temperature of 60 to 80° C.,
wherein the first paint has a viscosity of 13 to 15 g/cm·s at room temperature,
wherein the spraying device for spraying the first paint onto the outward surface of the sixth processed object has an ejection pressure of 0.8 to 1.0 bar, and
wherein said processed object no. 7-1 has the first paint coated in a thickness of 20 to 50 µm.

12. The method of manufacturing an automobile emblem according to claim 1, wherein said step of applying adhesion-painting comprises:
applying adhesion-painting on the outward surface of the seventh processed object with the second paint by way of a spraying device to provide a processed object no. 8-1; and
drying said processed object no. 8-1 for 25 to 30 minutes at 50 to 60° C.,
wherein the second paint has a viscosity of 14 to 16 g/cm·s at room temperature,
and wherein the spraying device for spraying the second paint onto the outward surface of the seventh processed object has an ejection pressure of 1.7 to 1.8 bar, and
wherein the second paint is an adhesive paint configured to improve adhesion between the seventh processed object and the polyvinyl-based resin during the transfer-molding of the polyvinyl-based resin.

13. The method of manufacturing an automobile emblem according to claim 1, wherein said step of transfer-molding a polyvinyl-based resin comprises:
preheating the eighth processed object at a second temperature to provide a processed object no. 9-1;
transfer-molding the polyvinyl-based resin on top of said processed object no. 9-1 to provide a processed object no. 9-2; and
drying said processed object no. 9-2,
wherein said transfer-molding comprises:
manufacturing said processed object no. 9-2 by way of a second mold comprising a second upper half mold and a second lower half mold, and a second cavity therebetween, the second upper half mold and the second lower half mold configured to provide a second holding space, and the second cavity connecting with the second holding space,
wherein the second upper half mold is maintained at a temperature of 55 to 65° C.,
wherein the second lower half mold is maintained at a temperature of 50 to 60° C.,
wherein the second upper half mold and the second lower half mold are pressed together with a clamping pressure of 2900 to 3100 kgf/cm$^2$,
wherein the second cavity is maintained at a temperature of 50 to 60° C., and
wherein said processed object no. 9-2 is manufactured by transfer-molding as the polyvinyl-based resin is transported from the second holding space into the second cavity.

14. The method of manufacturing an automobile emblem according to claim 13, wherein the polyvinyl-based resin comprises any one of polyvinyl chloride (PVC), polyvinylidene chloride (PVDC), polyvinyl acetate (PVAC), polyvinyl alcohol (PVAL), polyvinyl acetals, polystyrene (PS), AS resins, ABS resins, poly(methyl methacrylate) (PMMA), and fluorine resins.

15. The method of manufacturing an automobile emblem according to claim 13, wherein said step of preheating the eighth processed object is performed for 60 to 70 minutes at 60 to 80° C.

16. The method of manufacturing an automobile emblem according to claim 13, wherein said step of transfer-molding the polyvinyl-based resin further comprises keeping said processed object no. 9-2 at a holding pressure of 500 to 530 kgf/cm$^2$.

17. The method of manufacturing an automobile emblem according to claim 13, wherein said step of drying said processed object no. 9-2 is performed for 1 to 2 hours at 85 to 95° C.

18. The method of manufacturing an automobile emblem according to claim 1, wherein the second coating material has a viscosity of 11 to 13 g/cm·s at room temperature, and
wherein a spraying device for spraying the second coating material onto the outward surface of the ninth processed object has an ejection pressure of 0.8 to 0.9 bar.

19. The method of manufacturing an automobile emblem according to claim 1, wherein said step of irradiating UV rays with a second dose comprises:
preheating the tenth processed object for 3 to 5 minutes at 60 to 80° C. to provide a processed object no. 11-1;
irradiating the UV rays with the second dose onto said processed object no. 11-1 to provide a processed object no. 11-2;
irradiating IR rays onto said processed object no. 11-2 for 7 to 9 minutes at 55 to 60 ° C. to provide a processed object no. 11-3; and cooling said processed object no. 11-3 at 20 to 25° C. to provide the automobile emblem, and wherein the second dose is 2900 to 3100 mJ/cm².

20. An emblem for an automobile manufactured by the method of manufacturing an automobile emblem according to claim 1, the emblem having a metallic texture and a silver luster, wherein the emblem does not hinder a reception of electromagnetic waves of a vehicle front radar.

* * * * *